United States Patent [19]
Duncan
[11] 3,740,835
[45] June 26, 1973

[54] METHOD OF FORMING SEMICONDUCTOR DEVICE CONTACTS

[75] Inventor: David M. Duncan, San Francisco, Calif.

[73] Assignee: Fairchild Camera and Instrument Corporation, Syosset, Long Island, N.Y.

[22] Filed: Aug. 31, 1970

[21] Appl. No.: 68,466

Related U.S. Application Data

[63] Continuation of Ser. No. 683,363, Nov. 15, 1967, abandoned.

[52] U.S. Cl. .......... 29/578, 29/590, 117/212
[51] Int. Cl. .......... B01j 17/00
[58] Field of Search .......... 29/578, 589, 590, 29/591; 317/234 L, 234 M; 117/212

[56] References Cited

UNITED STATES PATENTS

| | | | |
|---|---|---|---|
| 3,413,157 | 11/1968 | Kuiper | 29/589 |
| 3,303,071 | 2/1967 | Kocsis | 317/234 |
| 3,365,628 | 1/1968 | Luxem et al. | 29/589 |
| 3,382,568 | 5/1968 | Kuiper | 29/578 |
| 3,502,517 | 3/1970 | Sussmann | 148/188 |

*Primary Examiner*—Charles W. Lanham
*Assistant Examiner*—W. Tupman
*Attorney*—Roger S. Borovoy and Gordon H. Telfer

[57] ABSTRACT

A semiconductor device contact is made by depositing a layer of semiconductor material in the contact opening of an insulating mask, metallizing, and heating to bond the metal to the layer of deposited semiconductor material and to the original device surface for permitting greater ease of contacting shallow junctions.

5 Claims, 3 Drawing Figures

PATENTED JUN 26 1973 3,740,835

INVENTOR.
DAVID M. DUNCAN
BY
Gordon H Telfer
ATTORNEY

METHOD OF FORMING SEMICONDUCTOR DEVICE CONTACTS

This application is a continuation of Ser. No. 683,363, filed Nov. 15,1967, now abandoned.

BACKGROUND OF THE INVENTION

1. Field of the Invention

This invention relates to ohmic contacts on semiconductor devices.

2. Description of the Prior Art

It has previously been a problem to consistently make good ohmic contacts to some shallow semiconductor regions. The problem occurs, for example, in silicon planar semiconductor devices as are usually formed with aluminum contacts. Even though the bonding temperature does not exceed the aluminum-silicon eutectic, about 575° C, shorting of the junctions may occur. One type of region in which this contacting problem frequently occurs is the emitter region of a transistor that is shallow (e.g., 0.5 micron deep and a width of about 0.1 mil). Contact is often formed through the diffusion mask window without a separate contact mask, such regions being referred to as washed emitters. The degree to which junction shorting occurs is variable and unpredictable.

SUMMARY OF THE INVENTION

It has now been recognized that prior aluminum contacts, as well as the metallization used for interconnects or bonding pads that extend over oxide on the adjacent portions of the surface, contain quantities of diffused silicon up to the solubility limit of silicon in aluminum which is about 2 percent by weight. It has also been recognized that junction shorting results from a phenomenon called "spiking" wherein projections of aluminum extend under the oxide at the surface of the device.

This invention provides an improved way of making ohmic contacts to semiconductor devices and is particularly advantageous in contacting shallow regions. The invention avoids the spiking problem occurring, for example, in silicon devices with aluminum contacts.

In accordance with this invention, device fabrication and metallization may be carried out as in the past with, however, the addition of a deposition of a layer of semiconductor material prior to the deposition of the contacting metal. In the case of silicon planar devices, for example, after the contact windows are formed through the oxide layer, a layer of silicon is deposited, as by vacuum evaporation, followed by a layer of aluminum as previously applied with subsequent heating to the bonding temperature. The resulting contact structure includes a layer of aluminum at the surface containing a considerable quantity of diffused silicon and the remaining portion of the deposited silicon layer to which aluminum has bonded to form conductive paths in contact with the device surface providing a good ohmic contact having low contact resistance without spiking.

BRIEF DESCRIPTION OF THE DRAWING

FIGS. 1–3 are cross-sectional views of a transistor device at successive stages of contact formation in accordance with this invention wherein FIGS. 2 and 3 are enlarged compared with FIG. 1 showing only a portion of the structure including the emitter contact.

DESCRIPTION OF THE PREFERRED EMBODIMENTS

Figure 1:
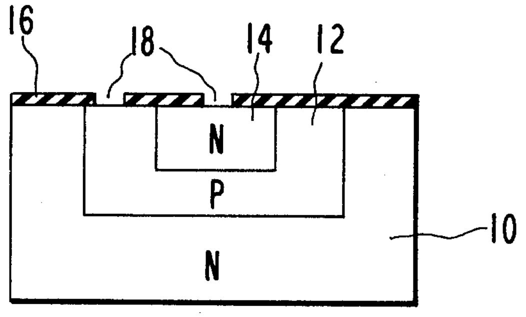

FIG. 1 illustrates a double diffused transistor in accordance with normal planar fabrication technology. In this case it is of NPN polarity although the polarity may be reversed. An N type collector region 10 has had successively diffused in it a P type base region 12 and an N type emitter region 14. The surface of the device is covered with a layer of insulating material 16, such as silicon dioxide, which has been processed to the point of forming what is referred to as a contact mask wherein all portions of the device surface are covered except where ohmic contacts are desired. Illustrated are openings 18 within the insulating layer at positions desired for the emitter and base contacts, it being normally the case that the collector contact would be made on the opposite surface of the device although where desired as in integrated circuits, it may also be made on the same surface. The method of this invention may be used to form any one or more of the contacts to a device.

Figure 2:
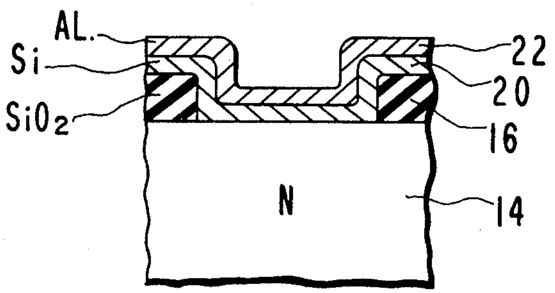

Normally the next step following the stage depicted in FIG. 1 would be to deposit a metal layer over the entire surface. However, in accordance with this invention there is first deposited, FIG. 2, a layer 20 of semiconductor material, for example silicon, at least in the contact openings and preferably over the oxide surface as well, following which metallization proceeds as before to provide metal layer 22. Following metallization and bonding at a temperature that may be as employed in prior aluminum contacting, the contacts, and any other desired metallization, are delineated by photolithographic techniques.

Figure 3:
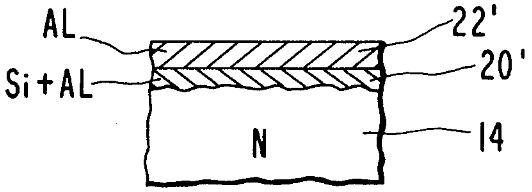

The resulting contact structure, FIG. 3, includes a first layer 20 immediately adjacent to the device surface consisting of the deposited silicon with aluminum having bonded to it in such a way as to make ohmic contact to the device surface while on the exposed portion of the contact a layer 22 of aluminum remains which incidentally also contains some silicon having diffused into it.

The deposited layer 20 may be nonepitaxial with deposition occurring with the substrate at a relatively low temperature (under 800° C and preferably lower, such as 200° to 400° C) which is high enough to form good contacts with a deposited layer continuous over the device surface including over the oxide layer. Such temperatures also have no appreciable effect on the diffusion profile in the existing monocrystalline structure. Even vacuum deposition on a substrate at room temperature is successful, particularly on P type regions, although somewhat higher temperatures are preferred for greater consistency of results.

An exact understanding of the mechanism by which the present invention works is not necessary for its successful practice. It is believed that the deposited silicon may prevent dissolution of silicon from the device surface to the extent that it inhibits the occurrence of spiking. However, it has previously been observed that the use of aluminum-silicon alloys for the contact metallization, even with large quantities of silicon in the deposited film failed to prevent occurrence of spiking, so the mechanism by which spiking is avoided through the practice of this invention is not apparent.

It is found important that the deposited silicon layer 20 have a minimum thickness depending to some extent on the thickness of the subsequently deposited aluminum layer. For example, for an aluminum layer of about 1/2 micron thickness it is necessary that the deposited silicon layer be at least about 200 angstroms while for an aluminum layer of about 1 micron thickness the deposited silicon layer should be at least about 300 angstroms. The aluminum may be several times thicker if the silicon is at least about 400 angstroms thick. Other qualities of the deposited silicon that are suitable for forming successful ohmic contacts in accordance with the methods of this invention are that it be amorphous or polycrystalline although even if some epitaxial growth should happen to occur the invention may be practiced. It is an advantage of the invention that the critical conditions required for consistently successful epitaxial growth are not necessary.

In the resulting contact structure it is believed the silicon layer thins down due to its dissolution in the aluminum. There is evidence that the remaining portion is characterized by areas of silicon that appear as the original silicon with, however, some other areas of aluminum enriched recrystallized material extend through the deposited silicon layer into contact with the original device surface in which additional recrystallized portions occur as in prior metallization.

The silicon layer may be deposited by techniques such as vacuum evaporation or by a vapor decomposition reaction. Vacuum evaporation is convenient in the formation of layers of high resistivity. However, in other respects it may be preferred to employ a vapor decomposition reaction with an impurity present to provide a doped layer (e.g. of opposite type to that in the original semiconductor body) which may be used as a diffusion source to form a shallow diffused region in the device structure if it is subjected to an appropriate heating cycle.

Materials having similar electrical and crystallographic properties to those of silicon may be used in the deposited layer, for example, germanium. However, the availability and ease of application of silicon layers, particularly in silicon device fabrication, makes its use much preferred. In addition, other known contact materials may be employed such as titanium, gold, chromium and others although it is considered an important advantage of the present invention that it may be employed with what is presently the most widely used semiconductor fabrication technique, that is, silicon planar devices with aluminum contacts, requiring only a modest change of previous fabrication technology.

Clear advantages are inherent in the invention as applied to contacting shallow junctions and considerable success in contacting junctions having depths below 1,000 angstroms has been achieved. However, this is not the limit of the advantages of the invention. For example, preliminary studies indicate that there may be improvement in lower contact resistance of ohmic contacts formed in accordance with this invention thus indicating that there is purpose in applying this technique even to semiconductor devices having relatively deep junctions, particularly those normally considered power devices in which it is desirable to have the highest current carrying capacity possible.

The invention permits a wide choice of contact metals than previously including those which are known to adhere well to silicon but not as well to silicon dioxide. Gold is one such metal that might be desirable for this purpose so as to permit an all gold contact and lead system avoiding aluminum-gold metallurgical reactions.

In the practice of this invention the heating to bond the metal by penetration through the deposited semiconductor layer may be performed either before or after the selective removal, as by photolithographic techniques, of the metal to define contacts, interconnects, and bonding pads. "Pre-alloying," i.e., performing the bonding operation before selective removal, is known to have an improved effect on device characteristics. Previously the practice of that technique with shallow junctions has not been very successful but good consistent results are now made possible by this invention.

The following more specific examples of the invention are provided by way of illustration:

Bipolar transistors were fabricated starting with a body of N type monocrystalline silicon in which P type base and emitter regions, respectively, were successively diffused through masks of silicon dioxide. The base was diffused to a depth of about 0.3 micron with a surface concentration of about $2 \times 10^{19}$ atoms per cubic centimeter. The emitter was diffused to a depth of about 2,000 angstroms with a surface concentration of about $2 \times 10^{20}$ atoms per cubic centimeter. The emitter was in the form of a stripe about 0.1 mil wide. The emitter was diffused without intentional reoxidation of the surface and the emitter contact window was opened by a quick etch in dilute HF acid. The window for the base contact was opened by application of photoresist and etching. A layer of silicon was deposited over the entire surface, including within the contact windows, by vacuum evaporation from a source having silicon lumps while the substrate was at a temperature of about 300° C. Deposition was continued for a time to provide a layer about 400 angstroms thick. An aluminum layer having a thickness of about 0.5 micron was vacuum evaporated onto the silicon layer by usual techniques. The structure was then heated to a temperature of about 500° C for about 2 minutes after which the aluminum was photolithographically removed except in the contact and bonding pad areas. The exposed silicon was then removed by a light silicon etch. A conventional collector contact was then formed on the opposite surface. A large number of devices were so fabricated simultaneously. Electrical tests established that the contacts were satisfactory with greater reliability than had been experienced with direct aluminization on otherwise similar devices.

Diodes and transistors of both polarities having junction depths down to about 600 angstroms have been contacted by this method with good success and it is believed likely that even shallower regions may be so contacted.

While the invention has been shown and described in a few forms only it is apparent that further modifications may be made without departing from the spirit and scope thereof.

I claim:

1. A method of making ohmic electrical contact to an active region enclosed by a shallow PN junction in a planar-type semiconductor device having an oxide protective layer overlying the principal surface of the device without substantially affecting the electrical characteristics of the shallow junction, the steps comprising:

removing a portion of the oxide protective layer overlying the active region to expose a portion of said principal surface above said active region while leaving the surface edge of the PN junction enclosing the region covered;

depositing a first layer of nonepitaxial semiconductive material at least over the exposed portion of said principal surface above said active region, said first layer being in direct contact with said principal surface above said active region;

depositing a second layer of conductive metal at least on the first layer;

heating the device to a temperature below the eutectics of the metal and the semiconductor materials for a period of time of about 2 minutes to bond the second layer to the first layer and provide ohmic electrical contact between the active region and the second layer without detrimentally affecting the electrical characteristics of the shallow PN junction enclosing the active region.

2. The method of claim 1 wherein the oxide protective layer comprises silicon oxide; the first layer comprises nonepitaxial silicon at least 200 angstroms thick; the second layer comprises aluminum deposited by evaporation; and the heating step is performed in a temperature range of about 300° C to about 565° C.

3. The method of claim 2 wherein the step of depositing the first layer is performed by evaporating silicon with the device temperature less than 800° C, the step continuing until the first layer is at least 300 angstroms thick; and the step of depositing the second layer continuing until the second layer is at least 100 angstroms thick.

4. The method of claim 1 wherein the first layer has a substantially higher resistivity than the first region.

5. The method of claim 1 wherein the first layer is doped with impurities.

* * * * *